(12) United States Patent
Pengelly

(10) Patent No.: US 7,855,893 B2
(45) Date of Patent: Dec. 21, 2010

(54) METHODS AND APPARATUS FOR AN IMPROVED PCB ASSEMBLY

(75) Inventor: Michael Pengelly, Fountain Hills, AZ (US)

(73) Assignee: Eberle Design, Inc., Phoenix, AZ (US)

( * ) Notice: Subject to any disclaimer, the term of this patent is extended or adjusted under 35 U.S.C. 154(b) by 414 days.

(21) Appl. No.: 11/386,224

(22) Filed: Mar. 21, 2006

(65) Prior Publication Data

US 2007/0223203 A1 Sep. 27, 2007

(51) Int. Cl.
*H05K 5/00* (2006.01)
*H05K 5/02* (2006.01)

(52) U.S. Cl. .............. 361/752; 361/728; 361/730; 361/679.59; 361/724; 174/520

(58) Field of Classification Search .......... 361/752, 361/796, 724, 728, 730, 736, 679.59, 679.01; 211/41.17; 174/50, 520
See application file for complete search history.

(56) References Cited

U.S. PATENT DOCUMENTS

| | | | | |
|---|---|---|---|---|
| 4,002,386 | A * | 1/1977 | McKenzie | 312/332.1 |
| 4,836,789 | A * | 6/1989 | Rudy et al. | 439/64 |
| 5,546,273 | A * | 8/1996 | Harris | 361/697 |
| 6,411,522 | B1 * | 6/2002 | Frank et al. | 361/800 |
| 6,449,171 | B1 * | 9/2002 | Karnes | 361/796 |
| 6,850,415 | B2 * | 2/2005 | Dimarco | 361/752 |
| 7,307,851 | B2 * | 12/2007 | Dimarco | 361/753 |

OTHER PUBLICATIONS

Eberle Design Inc, Product Catalog LMD Series Rack Mount Loop Montore with built in Deflectometer Technology and Accurate count Precise Count Outputs, http://www.editraffic.com/t_ild_n2.html, Jan. 2006 and http://www.editraffic.com/press/PRESS%2ORELEASE%20-%2OLMD%20DEFLECTOMETER%20Series.pdf, Mar. 2006.*
Elite Access Systems, Inc. A ELD Loop Detector, Retrieved from Internet <URL: www.eliteaccess.com/elite/product_manuals/0,1409,product_id-226,00.html.

(Continued)

*Primary Examiner*—Dameon E Levi
(74) *Attorney, Agent, or Firm*—Ingrassia Fisher & Lorenz, P.C.

(57) ABSTRACT

In general, an improved handle assembly in accordance with the present invention is configured to be removably attached to a printed circuit board (PCB), such as a vehicle detector PCB. The handle assembly includes a faceplate, a handle extending outward from the front surface of the faceplate, and an enclosure extending from the back surface of the faceplate, wherein the enclosure has an open side configured to interface with the printed circuit board, and an external surface configured to accept printed indicia (e.g., operating instructions relating to functionality of the printed circuit board). In a preferred embodiment, the handle assembly is an integral, plastic (e.g., polycarbonate) structure, and is configured to cover one or more temperature-sensitive components attached to the board.

14 Claims, 2 Drawing Sheets

OTHER PUBLICATIONS

Eberle Desgin, Inc. Indductve Loop Vehicle Detector, Retrieved from Internet <URL: www.editraffic.com/pdf/Ima1500.pdf.

Eberle Design, Inc. Oracle E Series Advanced LCD Vehicle Detectors Retrieved from Internet <URL : www.editraffic.com/pdf/oracle2e_4e.pdf.

Reno A & E, Rack Mount Loop Vehicle Detectors Retrieved from Internet <URL: www.renoae.com/Documentation/G/Archived/G/222%20(8-27-98).pdf.

3M Canoga, Vehicle Detection Sytem, Retrieved from Internet <URL: multimedia.mmm.com/mws/mediawebserver.dyn?6666660Zjcf6IVs6EVs666Y7PCOrrrrQ-.

* cited by examiner

METHODS AND APPARATUS FOR AN IMPROVED PCB ASSEMBLY

TECHNICAL FIELD

The present invention generally relates to board assemblies and, more particularly, to rack-mounted printed circuit board assemblies.

BACKGROUND

Rack-mounted printed circuit boards (PCBs) are used in a variety of applications because they are more compact and generally less expensive than boards that are incorporated into an enclosure or stand-alone case. While rack-mounted PCB assemblies are compact, they also have certain structure limitations, and are more prone to damage.

For example, it is common for a faceplate to be attached to one edge of the board, with the faceplate including some form of handle to allow a user manipulation of the assembly. Because of the resulting "L"-shaped structure, an unsatisfactory level of bending stress can arise at the interface of the board and the faceplate when the board is inserted and removed from the rack. This is particularly a problem in rack-mounted boards such as vehicle detector boards that require frequent maintenance, calibration, or re-configuration.

Furthermore, such rack-mounted board assemblies are often incorporated into field cabinets (e.g., traffic cabinets) that are subject to external weather conditions. Rapid temperature extremes can reduce the reliability or even cause damage to the components on the board. In addition, many electronic components are temperature dependent—that is, one or more of their electrical characteristics are a strong function of ambient temperature.

Another issue with prior art board assemblies is that such boards typically include switches, dials, sliders, or other actuatable components that are adjusted by the technician during setup and maintenance. This requires separate cards, printouts, or other forms of written instructions to be included with the board to assist the technician. Because space is often a premium in rack-mount systems and cabinets, there is very little room to store such written material. And even if it were to be stored or otherwise provided to the technician, the variety of boards appearing in a finished cabinet makes it impractical to quickly find an instruction card for a particular device.

Accordingly, there is a need for board assemblies that overcome these and other limitations of the prior art.

BRIEF SUMMARY

In general, an improved handle assembly in accordance with the present invention is configured to be removably attached to a printed circuit board (PCB), such as a vehicle detector PCB. The handle assembly includes a faceplate, a handle extending outward from the front surface of the faceplate, and an enclosure extending from the back surface of the faceplate, wherein the enclosure has an open side configured to interface with the printed circuit board, and an external surface configured to accept printed indicia (e.g., operating instructions relating to functionality of the printed circuit board). The handle assembly is an integral, plastic (e.g., poly-carbonate) structure, and is configured to cover one or more temperature-sensitive components attached to the board.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. Conventional techniques and devices used in connection with printed circuit board construction, vehicle detector operation, thermoplastic resins, and the like, are known in the art, and need not be described in detail herein.

In general, the present invention relates to an improved handle/PCB assembly including a faceplate, a handle extending outward from the front surface of the faceplate, and an enclosure extending from the back surface of the faceplate, wherein the enclosure has an open side configured to interface with the printed circuit board, and an external surface configured to accept printed indicia (e.g., operating instructions). The handle assembly is preferably an integral, plastic (e.g., polycarbonate) structure, and is configured to cover one or more temperature-sensitive components attached to the board. Rack-mounted PCB boards incorporating this invention are thus more rugged, durable, and provide improved protection and temperature stability for electronic components attached to the PCB.

Figure 2:
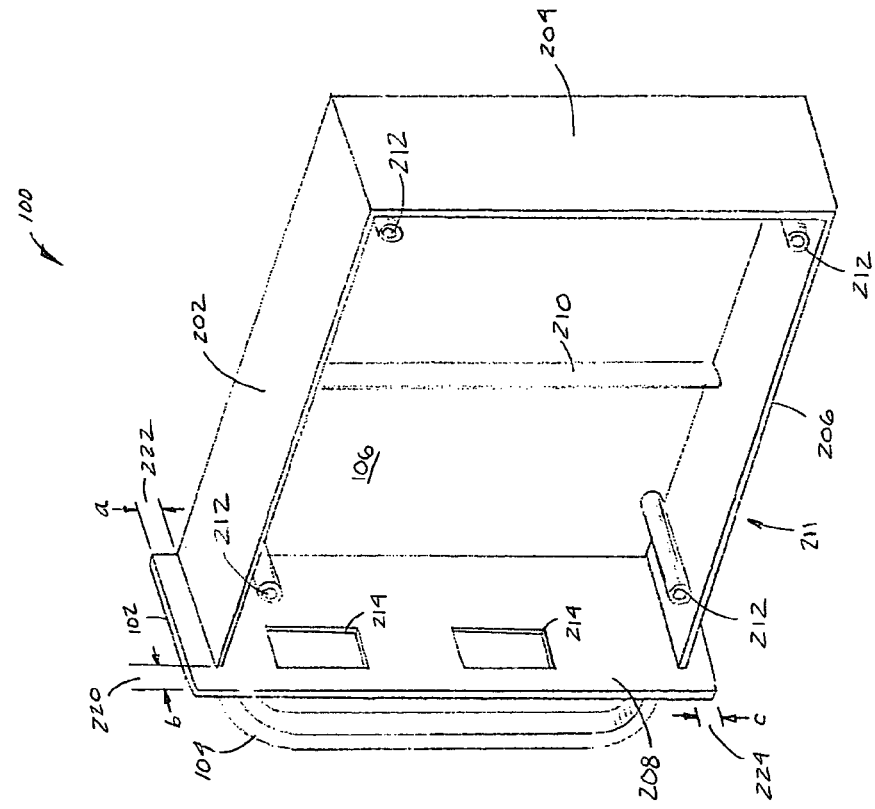
FIG. 2 is an alternate view of the handle assembly of FIG. 1.
Figure 1:
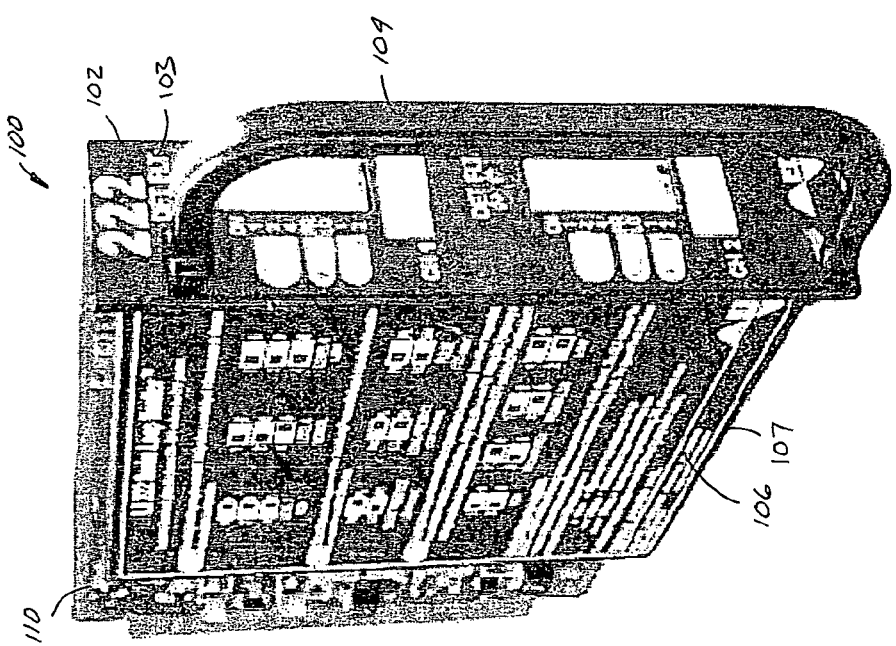
FIG. 1 is an isometric overview of a PCB assembly in accordance with one embodiment of the invention.

FIGS. 1 and 2 show alternate isometric overviews of an exemplary handle assembly (or simply "assembly") 100. In particular, FIG. 1 shows an isometric front view of an assembled unit (including both handle assembly 100 and PCB 110), while FIG. 2 shows an isometric rear view without an attached PCB. It will be understood that the figures are not intended to be scaled drawings, and that the present invention is not limited to the illustrated dimensions, graphics, or interrelationships between assembly components.

Referring now to both FIGS. 1 and 2, assembly 100 is configured to be removably attached (e.g., via suitable screws or other fasteners) to a printed circuit board 110. Assembly 100 includes a faceplate 102 having a front surface 103 and a back surface 208. Faceplate may have one or more openings or cutouts 214 provided therein—e.g., for exposing controls, displays, or other components that might be provided on PCB 110. Assembly 100 includes a handle 104 extending outward from front surface 103 of faceplate 102. In the illustrated embodiment, handle 104 is generally C-shaped, and is large enough that a human can easily grasp and pull assembly 100 and PCB 110 outward—e.g., to allow insertion and removal of the assembly from a cabinet rack.

Assembly 100 also includes an enclosure 211 extending from back surface 208 of faceplate 102. Enclosure 211 has an open side configured to interface with printed circuit board 110, and an external surface (or wall) 106 configured to accept printed indicia 107 (e.g., a label, laser marking, silk-screened graphics, or any other indicia).

Enclosure 211 is therefore defined by sidewalls 202, 204, and 206, as well as inner surface 208 of faceplate 102 and wall 106. Enclosure 211 may include one or more ribs 210 to provide further structural stability. It might also include a number of set-off structures 212 extending from the inner surface of 106 and configured to received screws or other fasteners placed on or through PCB 110.

In the illustrated embodiment, faceplate 102 has a rectilinear perimeter (in conformance with one or more specifications), and enclosure 211 has a rectilinear cross-section that is smaller than the rectilinear perimeter as viewed along an axis perpendicular to faceplate 102. That is, enclosure 211 is configured such that it does not interfere with insertion of board 110 into a suitable rack mount or cabinet.

In the illustrated embodiment, wall 202 is offset from the top of faceplate 102 by a distance a (222), sidewall 206 is offset from the bottom of faceplate 102 by a distance c (224), and the edge of sidewalls 202, 204, and 206 is offset by a distance b (220). Enclosure 211 may be, example, about 0.0050 to 0.100 inches thick. These dimension may be selected to achieve suitable stiffness and compatibility with the desired standards and/or design specifications.

In a preferred embodiment, handle 104, enclosure 211, and faceplate 102 are integral components composed of a single material. A variety of materials are suitable for this purpose, for example, a polycarbonate material such as LEXAN polycarbonate resin, produced by GE Plastics. Assembly 100 may be formed in any suitable manner. In a preferred embodiment, for example, it is fabricated in accordance with conventional plastic molding techniques known in the art.

Printed indicia 106 is preferably human-readable when assembly 100 is removed from the cabinet and/or rack in which it is placed. In that regard, indicia 106 may include a label, a laser marking, a silk-screened graphic, or any other graphical form that can be viewed and understood by a human. In one embodiment, wherein board 110 is a vehicle detector board, indicia 106 includes configuration and/or operational instructions for the device. For example, board 110 may include various switches (e.g., DIP-switches, dials, sliders, or other actuatable components) that control such settings as sensitivity, inductance, operational mode, frequency, etc. In such a case, it is desirable for indicia 106 to include a set of graphical representations of these components and the various settings that apply in order to assist the technician.

Furthermore, printed indicia 106 might instruct the technician how to interpret various output or error messages produced by the assembly. In a vehicle detector application, for example, one or more loop fault indicators (e.g., LEDs) might be incorporated into board 110, in which case printed indicia 106 might include instructions re interpreting this LED display.

In accordance with one aspect of the invention, enclosure 211 is shaped such that it encompasses or covers one or more components on board 110—particularly any temperature-sensitive components. The phrase temperature-sensitive components refers to electronic devices whose characteristics are a function of the local ambient temperature. In the context of a vehicle detector device, for example, the oscillator circuitry used in connection with inductive loops is typically temperature sensitive. The enclosure 211 may be configured to cover any portion of board 110.

Figure 3:
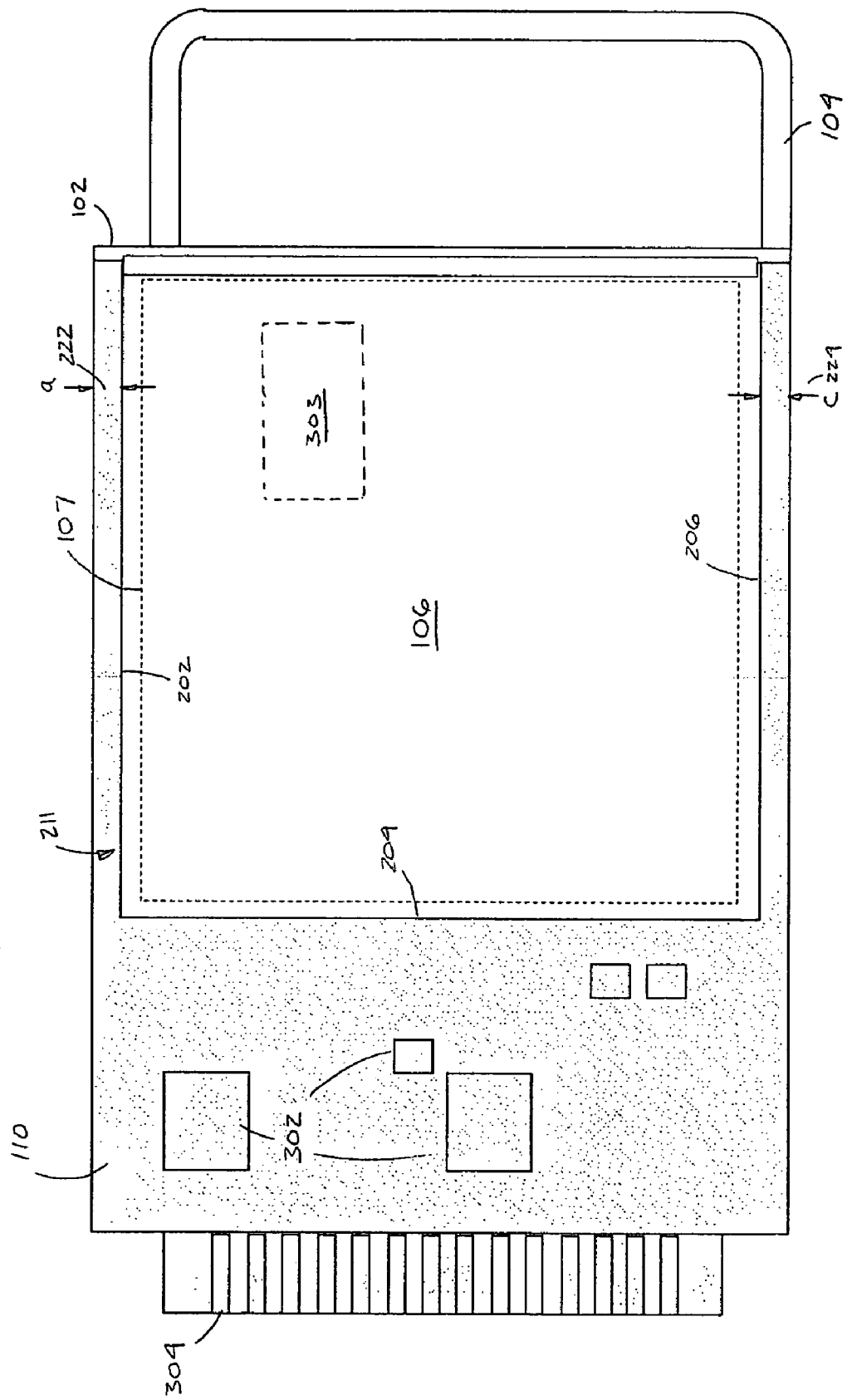
FIG. 3 is a side view of the PCB assembly of FIG. 1.

In one embodiment, for example, enclosure 211 extends at least half the length of the printed circuit board. Referring to the side view shown in FIG. 3, board 110, which typically includes an array of conductive contacts 304 for interfacing with a backplane (not shown), includes various attached components 302 and 303. Certain components (in the illustrated embodiment, component 303) are covered by enclosure 211, while other components (e.g., components 302) are not. Sidewalls 202, 204 and 206 define a footprint on board 110 that includes protected components.

The geometry of assembly 100 may be selected to conform to any desired specifications. In a preferred embodiment, assembly 100, when attached to a board 110, conforms to one or more traffic industry standards—e.g., Caltrans QPL, TSCES (1989, 1991 Add.), NEMA Standard TS1-1989, and NEMA Standard TS2-2003.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A handle assembly configured to be removeably attached to a printed circuit board, the handle assembly comprising:
   a faceplate having a front surface and a back surface;
   a handle extending outward from and integral with the front surface of the faceplate; and
   an enclosure extending from the back surface of and integral with the faceplate, the enclosure having an open side configured to interface with the printed circuit board, and an external surface configured to accept printed indicia, wherein the enclosure is a generally rectilinear box-like structure configured to removeably attach to the printed circuit board such that the enclosure does not extend beyond the perimeter of the printed circuit board; and
   wherein the faceplate includes one or more openings extending therethrough for exposing one or more respective components provided on the printed circuit board; and
   wherein the printed circuit board is the type having one or more temperature-sensitive components provided thereon, wherein the enclosure is shaped to encompass a first region of the printed circuit board that includes the temperature-sensitive components, and not encompass a second region of the printed circuit board.

2. The handle assembly of claim 1, wherein the faceplate has a rectilinear perimeter, and wherein the enclosure has a cross-section that is smaller than the rectilinear perimeter.

3. The handle assembly of claim 1, wherein the faceplate, the handle, and the enclosure are integral components composed of a single material.

4. The handle assembly of claim 3, wherein the material is a polycarbonate material.

5. The handle assembly of claim 1, wherein the enclosure is configured to interface with a vehicle detector printed circuit board.

6. The handle assembly of claim 1, wherein the enclosure is rectilinear.

7. The handle assembly of claim 1, wherein the printed circuit board has a length, and wherein the enclosure extends at least half the length of the printed circuit board.

8. The handle assembly of claim 1, wherein the enclosure is removeably attached to the printed circuit board at least three points.

9. The handle assembly of claim 1, wherein the enclosure includes an inner structural rib.

10. The handle assembly of claim 1, wherein the printed circuit board includes a plurality of switches, and wherein the printed indicia includes a visual representation of the plurality of switches.

11. A method for forming a printed circuit board assembly, comprising:
   providing a printed circuit board;
   forming, using a polycarbonate resin, an integral handle assembly comprising a faceplate having a front surface, a back surface, and at least one opening therein; a handle extending outward from the front surface of the faceplate; and a generally rectilinear box-like enclosure extending from the back surface of the faceplate, the enclosure having an open side and an external surface;
   applying printed indicia to the external surface of the handle assembly; and
   attaching the printed circuit board to the integral handle assembly such that said open side is adjacent said printed circuit board, the enclosure does not extend beyond the perimeter of the printed circuit board, and a component on the printed circuit board is exposed through the opening in the faceplate;
   wherein the printed circuit board includes one or more temperature-sensitive components, and wherein attaching the printed circuit board includes attaching the integral handle assembly such that said enclosure encompasses a first region including the temperature sensitive components, and does not encompass a second region that does not include the temperature sensitive components.

12. The handle assembly of claim 1, wherein the component is selected from the group consisting of a display component and a switch component.

13. The handle assembly of claim 5, wherein the temperature-sensitive components includes an oscillator component.

14. A vehicle detector assembly comprising:
   a vehicle detector printed circuit board including an oscillator component configured to be communicatively coupled to an inductive loop imbedded within a roadway; and
   a handle assembly configured to be removeably attached to the vehicle detector printed circuit board, the handle assembly comprising: a faceplate having a front surface and a back surface; a handle extending outward from and integral with the front surface of the faceplate; and an enclosure extending from the back surface of and integral with the faceplate, the enclosure having an open side configured to interface with the printed circuit board, and an external surface configured to accept printed indicia, wherein the enclosure is configured to removeably attach to the printed circuit board such that the enclosure does not extend beyond the perimeter of the printed circuit board;
   wherein the faceplate includes one or more openings extending therethrough for exposing one or more user interface components provided on the printed circuit board, wherein the user interface components include a plurality of loop fault indicators, and the printed indicia includes instructions for interpreting the loop fault indicators; and
   wherein the enclosure is shaped to encompass a first region of the printed circuit board that includes the oscillator component, and not encompass a second region of the printed circuit board.

* * * * *